(12) United States Patent
Ahmed et al.

(10) Patent No.: US 11,493,548 B2
(45) Date of Patent: Nov. 8, 2022

(54) PREDICTING FAILURE PARAMETERS OF SEMICONDUCTOR DEVICES SUBJECTED TO STRESS CONDITIONS

(71) Applicant: UCHICAGO ARGONNE, LLC, Chicago, IL (US)

(72) Inventors: Moinuddin Ahmed, Darien, IL (US); John N. Hryn, Hawthorn Woods, IL (US); Christopher Stankus, Hampshire, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 0 days.

(21) Appl. No.: 17/383,776

(22) Filed: Jul. 23, 2021

(65) Prior Publication Data
US 2022/0065919 A1 Mar. 3, 2022

Related U.S. Application Data

(60) Provisional application No. 63/072,412, filed on Aug. 31, 2020.

(51) Int. Cl.
*G01R 31/28* (2006.01)
*G01R 31/26* (2020.01)

(52) U.S. Cl.
CPC ..... *G01R 31/2642* (2013.01); *G01R 31/2848* (2013.01); *G01R 31/2874* (2013.01); *G01R 31/2879* (2013.01); *G01R 31/2881* (2013.01)

(58) Field of Classification Search
CPC ............ G01R 31/2653; G01R 31/2884; G01R 31/305; G01R 31/307; G01R 31/311; G01R 31/66
See application file for complete search history.

(56) References Cited

U.S. PATENT DOCUMENTS

2014/0125364 A1* 5/2014 Narayen ............ G01R 31/3008
324/750.03
2016/0341791 A1* 11/2016 Duffy ................... G01R 31/305

OTHER PUBLICATIONS

G. Romano et al., "An Ultrafast IR Thermography System for Transient Temperature Detection on Electronic Devices", IEEE 30th SEMI-THERM Symposium, Semiconductor Thermal Measurement and Management Symposium (SEMI-THERM), 2014.
(Continued)

*Primary Examiner* — Tung X Nguyen
(74) *Attorney, Agent, or Firm* — Marshall, Gerstein & Borun LLP

(57) ABSTRACT

A method for predicting failure parameters of semiconductor devices can include receiving a set of data that includes (i) characteristics of a sample semiconductor device, and (ii) parameters characterizing a stress condition. The method further includes extracting a plurality of feature values from the set of data and inputting the plurality of feature values into a trained model executing on the one or more processors, wherein the trained model is configured according to an artificial intelligence (AI) algorithm based on a previous plurality of feature values, and wherein the trained model is operable to output a failure prediction based on the plurality of feature values. Further, the method includes generating, via the trained model, a predicted failure parameter of the sample semiconductor device due to the stress condition.

20 Claims, 8 Drawing Sheets

(56) References Cited

OTHER PUBLICATIONS

M. Trivedi et al., "Failure Mechanisms of IGBT's Under Short-Circuit and Clamped Inductive Switching Stress", IEEE Transactions on Power Electronics, vol. 14, No. 1, pp. 108-116 (Jan. 1999).
G. Grasso et al., "Scanning Laser and Optical Beam Induced Current Methods for Failure Analysis of Electronic Devices", Proc. SPIE, vol. 1139, Optical Storage and Scanning Technology (1989).
F. Pozzobon et al., "Reliability characterization and FEM modeling of power devices under repetitive power pulsing", IEEE International Reliability Physics Symposium (IRPS), pp. 5C.4.1-5C.4.8 (2013).
G. Breglio et al., "Experimental Detection and Numerical Validation of Different Failure Mechanisms in IGBTs During Unclamped Inductive Switching", IEEE Transactions on Electron Devices, vol. 60, No. 2, pp. 563-570 (Feb. 2013).
I. Rossetto et al., "Evidence of Hot-Electron Effects During Hard Switching of AlGaN/GaN HEMTs", IEEE Trans. Elect. Dev., vol. 64, No. 9, pp. 3734-3739 (Sep. 2017).
R. Fujita et al., "Failure of Switching Operation of SiC-MOSFETs and Effects of Stacking Faults on Safe Operation Area", IEEE Trans. Elect. Dev., vol. 65, No. 10, pp. 4448-4454 (Oct. 2018).
A. Akturk et al., "Terrestrial Neutron-Induced Failures in Silicon Carbide Power MOSFETs and Diodes", IEEE Trans. Nucl. Sci., vol. 65, No. 6, pp. 1248-1254 (Jun. 2018).

\* cited by examiner

PREDICTING FAILURE PARAMETERS OF SEMICONDUCTOR DEVICES SUBJECTED TO STRESS CONDITIONS

STATEMENT REGARDING FEDERALLY SPONSORED RESEARCH OR DEVELOPMENT

This invention was made with government support under Contract No. DE-AC02-06CH11357 awarded by the United States Department of Energy to UChicago Argonne, LLC, operator of Argonne National Laboratory. The government has certain rights in the invention.

FIELD OF THE DISCLOSURE

The present disclosure relates to methods and systems for generating failure predictions of semiconductor devices, and specifically, to predicting failure parameters of semiconductor devices subjected to stress conditions.

BACKGROUND

Semiconductor devices are key components of power electronic systems and electronic devices more generally. Power electronic systems are used across a variety of industries, including the automotive, defense, aircraft, aerospace, oil and gas, and mining industries. The power electronic systems used in many of these industries can be exposed to harsh environments, such as environments prone to high temperature, high radiation, and/or transient electrical conditions. Due to the importance of semiconductor devices and power electronics to the functioning of a wide variety of systems, there is increased focus on reliability testing and understanding failure mechanisms of semiconductor devices.

However, due to the complexity of power electronic systems and the factors that can affect the failure of semiconductor devices, it is generally difficult to determine simultaneously when a semiconductor device is likely to fail, a location within the semiconductor device where the semiconductor device is likely to fail, why the semiconductor device is likely to fail, and at what conditions the semiconductor device is likely to fail. One existing technique, for example, utilizes parametric defect analysis through in situ electrical measurements and ex-situ electroluminescence imaging techniques. However, this technique requires removing layers of the physical device. Another example existing technique relies on technology computer-aided design (TCAD) to simulate the behavior of semiconductor devices, which is generally cumbersome and requires choice of simulation assumptions. Such existing techniques do not generally determine the exact root-cause of failure, such as the initial failure point within the device or the conditions at which the device fails.

Accordingly, there is a need for efficient, accurate methods for understanding failure mechanisms of semiconductor devices and predicting failure parameters, such as failure rates, of semiconductor devices.

SUMMARY OF THE DISCLOSURE

A method for training a model to predict failure parameters of semiconductor devices can be performed by one or more processors and includes receiving a first set of data. The first of data includes: (i) first characteristics of one or more first semiconductor devices, (ii) first measurements of the one or more first semiconductor devices captured while each of the one or more first semiconductor devices is subjected to one or more first stress conditions, and (iii) first parameters characterizing the one or more first stress conditions. The method further includes generating a first artificial intelligence (AI) training set based on the first set of data and on corresponding first failure parameters of the one or more first semiconductor devices due to the one or more first stress conditions, wherein at least one attribute of the corresponding first failure parameters is defined as a label of the first AI training set, and wherein one or more attributes of the first set of data are defined as feature values of the first AI training set. In addition, the method includes training a first iteration of a trained model with the first AI training set, the first iteration of the trained model operable to provide a first set of failure predictions having corresponding first error rates. Further, the method includes receiving a second set of data. The second set of data includes (i) second characteristics of one or more second semiconductor devices, (ii) second measurements of the one or more second semiconductor devices captured while each of the one or more second semiconductor devices is subjected to one or more second stress conditions, and (iii) second parameters characterizing the one or more second stress conditions. The method further includes generating a second AI training set based on the second set of data and on corresponding second failure parameters of the one or more second semiconductor devices due to the one or more second stress conditions, wherein at least one attribute of the corresponding second failure parameters is defined as a label of the second AI training set, and wherein one or more attributes of the second set of data are defined as feature values of the second AI training set. The method also includes training a second iteration of the trained model with the second AI training set, the second iteration of the trained model operable to provide a second set of failure predictions having corresponding second error rates, wherein the second error rates have a reduced overall error rate compared to an overall error rate of the first error rates.

Another method for predicting failure parameters of semiconductor devices can be performed by one or more processors and includes receiving a set of data. The set of data includes (i) characteristics of a sample semiconductor device, and (ii) parameters characterizing a stress condition. The method further includes extracting a plurality of feature values from the set of data, the plurality of feature values including one or more feature values of the characteristics of the sample semiconductor device and one or more feature values of the parameters characterizing the stress condition. The method also includes inputting the plurality of feature values into a trained model executing on the one or more processors, wherein the trained model is configured according to an artificial intelligence (AI) algorithm based on a previous plurality of feature values, and wherein the trained model is operable to output a failure prediction based on the plurality of feature values. Further, the method includes generating, via the trained model, a predicted failure parameter of the sample semiconductor device due to the stress condition.

Yet another method for predicting failure parameters of semiconductor devices can be performed by one or more processors and includes receiving a set of data. The set of data includes (i) characteristics of a sample semiconductor device, and (ii) parameters characterizing a stress condition. The method further includes extracting a plurality of feature values from the set of data, the plurality of feature values including one or more feature values of the characteristics of the sample semiconductor device and one or more feature values of the parameters characterizing the stress condition. The method also includes inputting the plurality of feature values into a model executing on the one or more processors, wherein the model is configured according to an algorithm that assigns weights to the plurality of feature values according to analysis of a previous plurality of feature values, and wherein the trained model is operable to output a failure prediction based on the plurality of feature values. Further, the method includes generating, via the trained model, a predicted failure parameter of the sample semiconductor device due to the stress condition.

DETAILED DESCRIPTION

Figure 1:
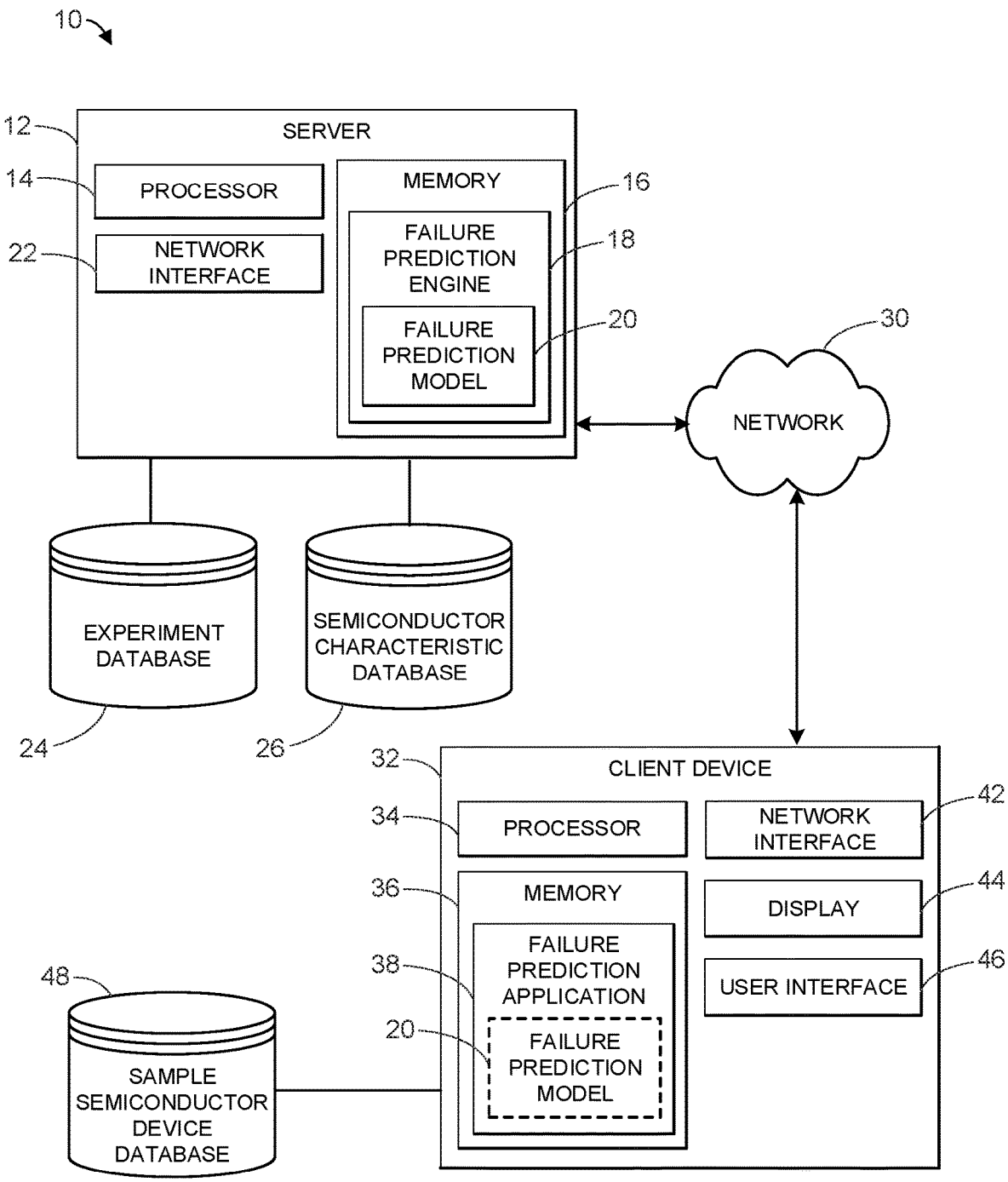
FIG. 1 is a block diagram of a system for predicting failure parameters of semiconductor devices.

The disclosed methods and systems describe experimental techniques for gathering measurements of semiconductor devices under stress conditions and using such measurements to train models operable to predict failure parameters of semiconductor devices. The disclosed experimental techniques include using high-speed x-ray imaging to capture in-situ images of semiconductor devices while stress conditions are applied. The images depict failure locations (e.g., locations of defect formation) at the initial time of failure. The experimental techniques also include measuring semiconductor device parameters (e.g., current, voltage, resistance, power, etc.) while stress conditions are applied. Such stress conditions include high temperatures (e.g., up to approximately 800° C.), electrical transients such as voltage and current spikes, and neutron radiation. In accordance with the techniques of this disclosure, the angle of incidence of neutron radiation with respect to a tested semiconductor device can be changed in order to analyze the effect of angular placement on semiconductor device failure.

Training data sets are generated using experimental measurements and images, parameters characterizing stress conditions, characteristics of the semiconductor devices (e.g., type of device, material type, operating voltage, voltage rating, current rating, etc.), and failure parameters of the semiconductor devices (e.g., whether a device failed, when the device failed, the location within the device where a failure occurred or a defect formed, etc.). A model can be iteratively trained using such training data sets. Feature values extracted from a data set including characteristics of a sample semiconductor device and a candidate stress condition can then be input into the trained model to obtain failure predictions regarding the sample semiconductor device under the candidate stress condition.

The contemplated methods include capturing in situ measurements, including images, of semiconductor devices, enabling training of a model operable to output failure predictions regarding sample semiconductor devices under candidate stress conditions. Due to the in situ nature of the measurements, the techniques disclosed herein can be used to determine the conditions present at the time of failure and the precise location and time of defect formation, dielectric breakdown, or other failure mechanism. Further, using such measurements, the model can be trained to identify predicted failure locations, failure rates, times to failure, and conditions relevant to failure.

The systems and methods of the present disclosure offer numerous benefits. Compared to existing techniques, the disclosed techniques rely on in-situ measurements and therefore more precisely identify the location, time, and cause of historical past failures. The disclosed techniques also more effectively analyze the effect of neutron radiation on semiconductor devices by obtaining measurements with the devices at varied angular placements from a neutron source. In addition, the disclosed techniques use measurements of past failures to more accurately predict possible failures of sample devices. Further, unlike existing techniques, the disclosed techniques do not require TCAD simulations or post-testing etching or removal of semiconductor device layers.

FIG. 1 is a block diagram depicting an example system 10 configured to implement the techniques of this disclosure for predicting failure parameters of semiconductor devices. It should be appreciated that the system 10 is merely an example and that alternative or additional components are envisioned.

The system 10 may include a server 12 configured to communicate with a client device 32 via a network 30. The network 30 may include any suitable combination of wired and/or wireless communication networks, and may support any type of data communication via any standard or technology (e.g., GSM, CDMA, TDMA, WCDMA, LTE, EDGE, OFDM, GPRS, EV-DO, UWB, Internet, IEEE 802 including Ethernet, WiMAX, Wi-Fi, Bluetooth, fifth-generation (5G) mobile network, and others). While FIG. 1 depicts only one network 30, the server 12 and the client device 32 may additionally or alternatively communicate via a plurality of networks, depending on the implementation, and still fall within the scope of the present disclosure. For example, the network 30 may include any one or more of an Ethernet-based network, a private network, a cellular network, a local area network (LAN), and/or a wide area network (WAN), such as the Internet.

The server 12 includes one or more processor(s) 14, which may be general purpose (e.g., CPUs) and/or special purpose processor(s), and a memory 16. The memory 16 may be a non-transitory memory and can include one or several memory modules, such as random access memory (RAM), read-only memory (ROM), flash memory, or other types of persistent memory, etc. The memory 16 can store computer-readable instructions executable on the processor 14. It will be understood that although the server 12 is illustrated in FIG. 1 as a single device, in general the server 12 can correspond to multiple servers and/or computing devices.

The memory 16 may store a failure prediction engine 18. In some embodiments, the failure prediction engine generates a failure prediction model 20. The failure prediction engine 18 may use training data (e.g., from an experiment database 24 and a semiconductor characteristic database 26, discussed below) to train the failure prediction model 20 to predict failure parameters of semiconductor devices, as will be discussed with reference to FIGS. 3A-3B. Although in some embodiments the failure prediction model 20 is a trained machine learning model, in other embodiments the failure prediction model 20 includes statistical and/or rules-based algorithms to generate failure predictions for semiconductor devices. For example, the failure prediction model 20 may be configured to extract features of data regarding a particular sample semiconductor device and a candidate stress condition. The failure prediction model 20 may apply rules to the identified features, compare the identified features to historical statistics, and/or analyze the identified features in view of historical statistics to generate failure predictions. For instance, a rule may indicate to the failure prediction model 20 that a certain group of features indicate that a sample semiconductor device will likely have a particular response to the candidate stress condition. As another example, the failure prediction engine 18 may generate a statistical algorithm by analyzing historical statistics to assign weights to certain features, where the algorithm is configured to generate a failure prediction based on a set of input features.

Further, although not illustrated in FIG. 1, the server 12 may include one or more displays and/or user interfaces to enable a user to configure the failure prediction engine 18 and failure prediction model 20. For example, a user may interact with a graphical user interface to view error rates of failure predictions, add labels to training data, classify failure predictions depending on accuracy, etc.

As mentioned previously, training data used to train the failure prediction model 20 may be stored in the experiment database 24 and the semiconductor characteristic database 26. The experiment database 24 may be populated with data gathered using an experimental setup, such as the experimental setup depicted described below with reference to FIG. 2A. For example, the experimental database 24 may include measurements of semiconductor devices captured while each of the semiconductor devices is subjected to one or more stress conditions, as well as parameters characterizing the one or more stress conditions. The semiconductor characteristic database 26 includes characteristics of semiconductors and/or semiconductor devices. Such characteristics may include, for example, material types, doping levels and/or types, operating voltages, voltage rating, current ratings, operating frequency, etc. Thus, the characteristics may include intrinsic characteristics of the devices, or operating characteristics such as operating voltages. The characteristics may also include known or average failure parameters for the semiconductor devices, such as failure rates (e.g., failure-in-time (FIT) rates), times to failure, indications of defect formation, etc. The semiconductor characteristic database 26 may include characteristics of semiconductor devices of the same type (e.g., the database 26 may store characteristics of semiconductor devices of a same material type, a same doping level, a same structure, a same type of transistor, etc.), or may include characteristics of semiconductor devices of different types. For example, a first subset of the semiconductor devices may be a first type and a second subset of the semiconductor devices may be of a second type.

Further, the server 12 includes a network interface 22 configured to communicate data with other devices, such as the client device 32, via the network 30. The network interface 22 may include one or more transceivers (e.g., WWAN, WLAN, and/or WPAN transceivers) functioning in accordance with IEEE standards, 3GPP standards, or other communication standards, and configured to receive and transmit data via one or more external ports.

Generally speaking, the client device 32 may be, for example, a personal computer, a portable device such as a tablet computer, laptop, or smartphone, a wearable computing device, etc. The client device 32 includes a processor 34, a memory 36, and a network interface 42, which may be similar to the processor 14, the memory 16, and the network interface 22 of the server 12, respectively. The client device 32 further includes a display 44 and a user interface 46. The display 44 may include a screen (e.g., a smartphone or tablet screen, or monitor) for displaying information to a user. The user interface 46 may be configured to enable a user to interact with the client device 32. For example, the user interface 46 may include an interactive feature of the display 44 (e.g., the display 44 may be a touchscreen), a keyboard, a mouse, a voice input device, and/or any other suitable user-input device(s).

The memory 36 includes a failure prediction application 38 configured to facilitate the failure prediction techniques of this disclosure. In some implementations, the failure prediction application 38 may be stored as instructions in a cloud-based memory. Further, in some implementations, the failure prediction application 38 may include all or part of the failure prediction model 20 and may implement the failure prediction model 20. For example, the server 12 may transmit the failure prediction model 20 to the client device 32 (e.g., in response to a request received from the failure prediction application 38) and the client device may store a local version of the failure prediction model 20. In other implementations, the client device 32 may not store the failure prediction model 20. In such implementations, the failure prediction application 38 may transmit a request to the server 12 (e.g., in response to a user-configured request for a failure prediction regarding a sample semiconductor device), and the server 12 may implement the failure prediction model 20.

The failure prediction application 38 may, when executed by the processor 34, cause the display 44 to present to the user of the client device 32 a graphical user interface (GUI). The GUI may include one or more interactive controls that enable the user to input a sample semiconductor device and a candidate stress condition. The user may manually input characteristics of a particular semiconductor device, or may use the GUI to select a particular semiconductor device. Characteristics of one or more sample semiconductor devices may be stored in a sample semiconductor device database 48 accessible by the client device 32, or may be stored in the memory 36. The failure prediction application 38 may retrieve the characteristics of a selected semiconductor device from the sample semiconductor device database 48 or from the memory 36. The failure prediction application 38 then may (e.g., in response to a selection received from a user via the GUI) format a request for a failure prediction regarding the selected sample semiconductor device under the candidate stress condition and transmit the request to the server 12 for processing. In implementations where the failure prediction model 20 is stored at the client device 32 or otherwise accessible by the failure prediction application 38 (e.g., via cloud-based memory), the failure prediction application 38 may perform the functionality of the server 12 and implement the failure prediction model 20 to generate the failure prediction. The interactive controls of the GUI may also enable the user to retrieve notifications received at the client device 32 indicating a generated failure prediction (e.g., received from the server 12 or generated by the failure prediction application 38).

The databases 24, 26, and 48 may use any known database architecture. Further, one or more of the databases 24, 26, and 48 may be implemented using cloud technology and may reside on a distributed network of computing devices rather than a single computing device.

Figure 2A:
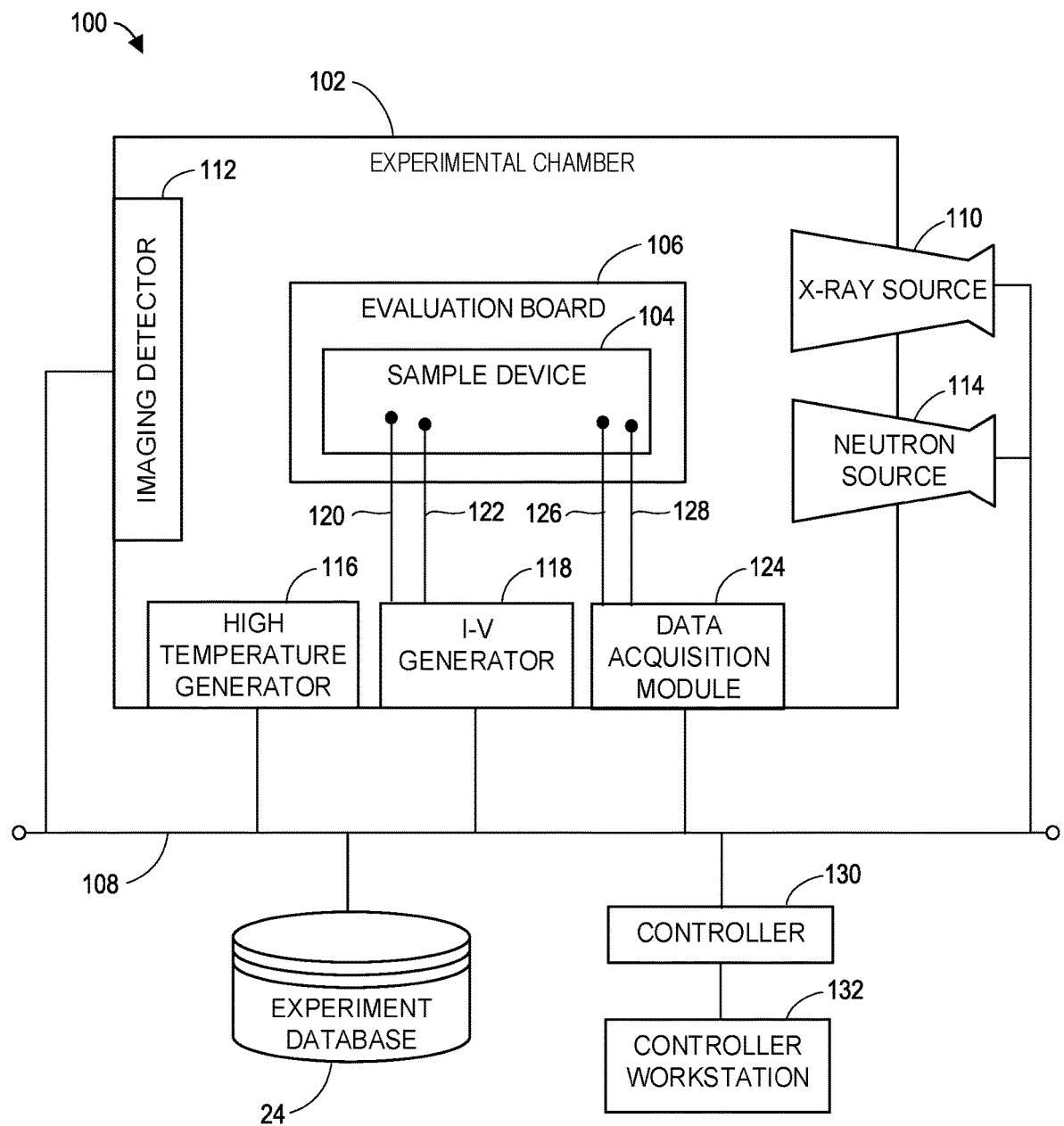
FIG. 2A is a block diagram of an experimental chamber for collecting measurements relating to semiconductor devices subjected to various stress conditions.

Turning to FIG. 2A, an example experimental setup 100 may be used to collect measurements relating to semiconductor devices subjected to various stress conditions. A sample semiconductor device 104 (also referred to herein as a sample device 104) may be placed within an experimental chamber 102 such that measurements may be collected relating to the sample device 104. Various components of the experimental setup 100 may subject the sample device to one or more stress conditions, such as neutron radiation, high temperatures, voltage spikes, and current spikes. The stress conditions may be applied to the sample device 104 at different times, sequentially, or in combination. Further, the stress conditions may vary with time. For example, the temperature and/or the neutron flux applied to the sample device 104 may vary with time.

The sample device 104 may be a single discrete device or may include an integrated circuit (IC) chip comprised of multiple devices. Example devices include transistors, including field-effect transistors (FETs), metal-oxide-semiconductor FETs (MOSFETs), thyristors, bipolar junction transistors (BJTs), insulated-gate bipolar transistors (IGBTs), etc., diodes, and power electronics devices, including power transistors, power MOSFETs, power switching devices, etc.

A evaluation board 106 may hold and position the sample device 104 within the experimental chamber 102. For example, the evaluation board 106 may include a mount for the sample device 104. The evaluation board 106 may hold the sample device 104 stationary within the experimental chamber 102. The evaluation board 106 may be capable of changing the position and/or angle at which the sample device 104 is held, as will be discussed below with reference to FIG. 2B.

The experimental chamber 102 may include an x-ray source 110 which generates x-ray beams for the purpose of x-ray imaging of the sample device 104. Additionally or alternatively, the x-ray beams may be a stress condition applied to the sample device 104. The x-ray source 110 may be capable of producing ultra-bright, high energy x-ray beams. Further, the experimental chamber 102 may include an imaging detector 112. The imaging detector 112 collects diffracted x-rays, which may be converted into visible light, to produce an image of the sample device 104. The x-ray source 110 and the imaging detector 112 may be configured to perform high speed x-ray imaging (e.g., frame rates of up to 10 MHz). The high speed x-ray imaging can be used to perform in-situ imaging of the sample device 104. For example, the captured images may indicate at what layer and/or position of the sample device 104 defect formation starts due to a stress condition.

The experimental chamber 102 may also include a neutron source 114 which generates neutron radiation (e.g., in the form of a neutron beam). The neutron source 114 may produce ionizing neutron radiation with a neutron flux ranging up to $10^5$ neutrons/cm$^2$/s. In some implementations, the neutron source 114 may produce neutron radiation with a neutron flux exceeding $10^5$ neutrons/cm$^2$/s. The neutrons emitted by the neutron source may have energies ranging from approximately 1 MeV to 800 MeV. The incident neutron radiation simulates, on an accelerated timeline due to the magnitude of the neutron flux, the effects of radiation on semiconductor devices in environments with high levels of radiation, such as at high altitudes or outer space.

Figure 2B:
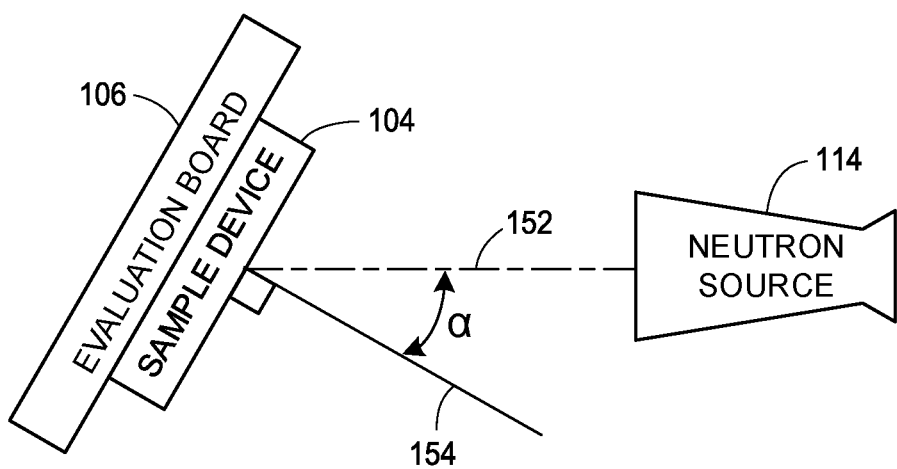
FIG. 2B is a block diagram illustrating a sample semiconductor device rotated such that neutron radiation is incident at a non-zero angle of incidence.

Referring briefly to FIG. 2B, the sample device 104 may be positioned within the experimental chamber 102 such that incident radiation, such as incident radiation 152 from the neutron source 114, is incident at a non-zero angle of incidence $\alpha$. The angle of incidence $\alpha$ is the angle between the incident radiation 152 and a line perpendicular to the surface at the point of incidence (i.e., a surface normal 154). If the angle of incidence $\alpha$ is zero degrees, radiation is incoming parallel to the surface normal. The angle of incidence $\alpha$ may be changed if the evaluation board 106 rotates the sample device 104 within the experimental chamber 102, as illustrated in FIG. 2B. Additionally or alternatively, the angle of incidence $\alpha$ may be changed by changing the location of the neutron source 114. In some implementations, measurements may be captured while the angle of incidence $\alpha$ is continuously changed. In other implementations, measurements may be taken with the sample device 104 at a constant first angle of incidence $\alpha_1$, other measurements may be taken with the sample device 104 at a constant second angle of incidence $\alpha_2$, and so on. In relation to the neutron source 114, the sample device 104 may be rotated through all angles (i.e., through 360°).

Referring back to FIG. 2A, the experimental chamber 102 further includes a high temperature generator 116. The high temperature generator 116 may be configured to produce temperatures ranging from room temperature to approximately 800° C. In some implementations, the high temperature generator 116 may produce temperatures exceeding 800° C., such as temperatures ranging up to 1000° C., or other temperatures simulating possible operating conditions of semiconductor devices in harsh environments.

Still further, the experimental chamber 102 may include an current-voltage (I-V) generator 118. The I-V generator may include at least two probes (e.g., probes 120 and 122) through which the I-V generator 118 can apply currents and/or voltages to the sample device 104. The locations of the probes 120 and 122 may be altered to apply currents and/or voltages across different sections of the sample device 104. The I-V generator 118 can apply current and/or voltage signals of different shapes, frequencies, and time lengths. For example, the I-V generator 118 can apply a constant voltage, an alternating voltage, or a voltage spike. A voltage spike, for example, is a short, transient voltage, which may have a magnitude greater than an voltage rating of the sample device 104. Similarly, the I-V generator 118 can apply a current spike, which may be a short, transient current that may have a magnitude greater than a current rating of the sample device 104. Further, the I-V generator 118 can drive the sample device 104 at various frequencies. Driving the sample device 104 at a high frequency may be considered an example stress condition. Although FIG. 2A depicts two probes 120 and 122, the I-V generator may include more than two probes for application of voltages and currents across different sections of the sample device 104. Further, the I-V generator 118 may comprise multiple current and/or voltage generators.

Furthermore, the experimental chamber 102 may include a data acquisition module 124. The data acquisition module 124 includes at least two probes 126 and 128, which may be connected to the sample device 104 to measure parameters of the sample device 104. The parameters may include voltages, currents, dissipated power, resistances, internal temperatures, operating frequencies, etc. The probes 126, 128 may be positioned at or within the sample device 104 so as to gather in situ electrical measurements.

The various components of the experimental setup 100 may be communicatively connected via wired or wireless connections to a data bus 108. The data bus 108 may in turn be communicatively connected to the experiment database 24. The components of the experimental setup 100 can transmit or otherwise provide, via the data bus 108, measurements of the semiconductor devices and parameters characterizing the applied stress conditions, if any. For example, the x-ray source 110 may provide indications of the x-ray wavelength, frequency, energy, flux, etc. applied to the sample device 104 to the data bus 108 for storage at the experiment database 24. The imaging detector 112 may provide captured images and/or data characterizing the images to the data bus 108. The neutron source 114 may provide indications of the neutron flux or neutron energies of the neutron beam. The high temperature generator 116 may provide indications of the temperatures applied to the sample device (e.g., the temperatures applied as a function of time). The I-V generator 118 may provide indications of the voltages and currents applied to the sample device 104 and at what terminals or locations of the sample device 104 the voltages and/or currents were applied to. Still further, the data acquisition module 124 may provide collected measurements to the data bus 108. The measurements and parameters may include time stamps such that the various stress conditions and measurements may be correlated. For example, the time stamps can be used to determine that a particular image captured by the imaging detector 112 indicating defect formation was captured at the same time that a voltage spike was applied by the I-V generator 118.

The experimental database 24 may also include failure parameters for the sample device 104. The failure parameters may include indications of failure of the sample device 104 or components of the sample device 104 and may be included within the measurements and images. The failure parameters may be explicitly included in the data in the experimental database 24 or may be derived based on the measurements and images from the data acquisition module 124 and the imaging detector 112. For example, a user interacting with access to the measurements and images (e.g., via the server 12 or via a controller workstation 132, described below) may identify a time as associated with a current, voltage, or defect formation indicating device failure based on the data. As another example, an algorithm may identify a time associated with a current, voltage, or defect formation indicating device failure based on the data. In any event, the failure parameters may indicate whether device failure occurred under the applied stress condition, when device failure occurred (e.g., a time range, an initial time when device failure began, or time to failure of the sample device 104), where device failure occurred (e.g., at what layer of a device stack of the sample device 104), a failure rate of the sample device 104 (e.g., a FIT rate, indications of defect formation (e.g., whether defects formed, the degree of defect formation, where defects formed, when defects formed, etc.), whether dielectric breakdown has occurred within the device (as well as where and when the dielectric breakdown occurred), indications of thermal runaway (e.g., whether, where, and when thermal runaway occurred), indications of current overflow (e.g., whether, where, and when current overflow occurred), etc.

The images and measurements captured by the imaging detector 112 and the data acquisition module 124 may be continuously, periodically, or aperiodically captured between application of the various stress conditions and a point of failure of the sample device 104 (e.g., as images or data curves as a function of time). Additionally or alternatively, the images and measurements captured by the imaging detector 112 and the data acquisition module 124 may be captured at a points of failure of the sample device 104. Further, in some embodiments, baseline images and baseline measurements may be captured by the imaging detector 112 and/or the data acquisition module 124 before any stress conditions are applied to the sample device 104.

Further, the various components of the experimental setup 100 (e.g., the evaluation board 106, the x-ray source 110, the imaging detector 112, neutron source 114, the high temperature generator 116, the I-V generator 118, the data acquisition module 124) may be controlled by a controller 130. The controller 130 may include control circuitry for controlling the components. For example, the controller 130 may control the activation and/or deactivation of the components, modify settings of the components, and modify notification settings of the components (e.g., what information the components provide to the data bus 108 and at what times). The controller 130 may transmit data and instructions to the components via the data bus 108, and may receive information (e.g., responses to the instructions, monitoring information regarding the components) from the components via the data bus 108. Further, the controller 130 may provide data (e.g., data exchanged with the components of the experimental setup 100) to the data bus 108. This data may include indications of components of the experimental setup 100 that are activated or deactivated (e.g., including timestamps), as well as indications of controlled settings and indications of instances in which controlled settings are modified (e.g., including timestamps).

A user may issue instructions to the controller 130 and monitor information received at the controller 130 via a controller workstation 132. The controller workstation 132 may be, for example, a personal computer, a laptop, smartphone, tablet, wearable portable device, etc. Generally speaking, the controller workstation 132 may include a processor, memory, network interface, display, and user interface, similar to the client device 32. Although FIG. 2A depicts a single controller 130 coupled to a single controller workstation 132, the experimental setup 100 may include multiple controllers and/or multiple controller workstations. For example, each component of the experimental setup 100 may be associated with a different controller. Each controller may be associated with one controller workstation, or a controller workstation can be used to configure multiple controllers.

For ease of explanation, FIG. 2A illustrates a single experimental chamber 102 as including the x-ray source 110, the imaging detector 112, the neutron source 114, the high temperature generator 116, and the I-V generator 118. However, some or all of these measurement and stress condition-producing devices may be located at different experimental chambers. For example, a first experimental chamber may include the x-ray source 110, the x-ray detector 112, the I-V generator 118, and the data acquisition module 124, but may not include the high temperature generator 116 and the neutron source 114. Measurements related to neutron radiation and/or high temperature may be collected at a different experimental site or chamber using the same sample device 104 or another sample device. Measurements collected at different experimental sites or chambers may be collected and aggregated at the experiment database 24. Moreover, although the above disclosure generally refers to components as included in the experimental chamber 102, the components (or parts of the components) may be physically located outside the experimental chamber 102, but may be coupled to the experimental chamber 102. For example, all or part of the high temperature generator 116 may be located outside the experimental chamber 102, but the high temperatures produced by the high temperature generator 116 are applied to or felt within the experimental chamber 102.

In accordance with the above, the experiment database 24 can include data captured at multiple experimental chambers related to a sample device 104. Further, the measurements and images regarding other sample devices, of the same type as the sample device 104 or of different types, captured at the same or different experimental chambers can also be collected and aggregated at the experiment database 24.

Furthermore, additional measurement devices and stress condition-producing devices not illustrated within FIG. 2A may collect other measurements and apply other stress conditions to the sample device 104 and still fall within the scope of the present disclosure. For example, although this disclosure primarily refers to neutron radiation, other radiation types may also be applied as stress conditions, such as charged particle radiation, alpha particle radiation, beta particle radiation, electromagnetic radiation, including gamma radiation, x-ray radiation (e.g., from the x-ray source 110), and ultraviolet radiation. As another example, although FIG. 1 includes a high temperature generator 116, a low temperature generator capable of applying low temperatures (e.g., below room temperature, below 0° C., or approximately 3 Kelvin (the average temperature of outer space) may apply the low temperatures as stress conditions.

Figure 3A:
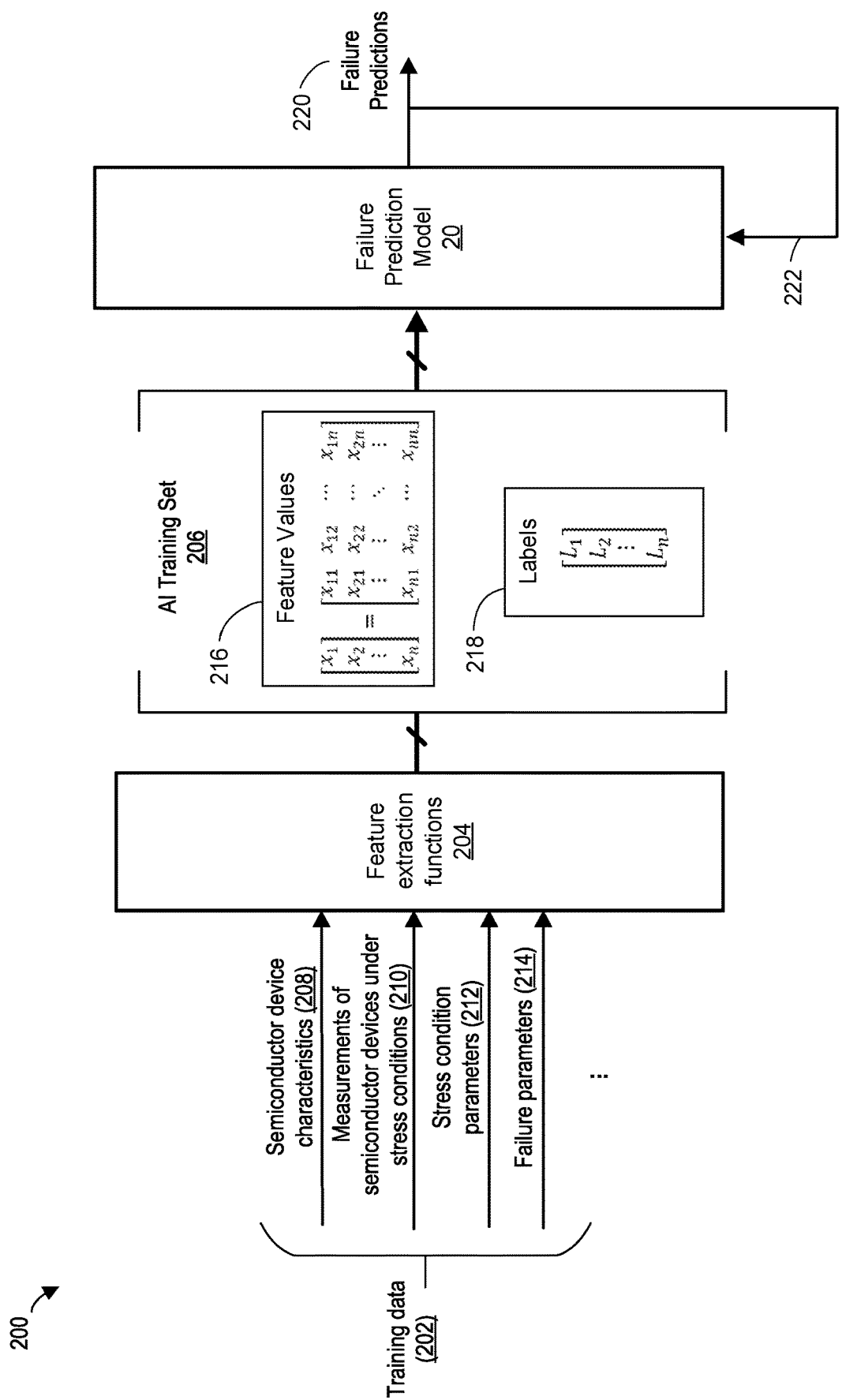
FIGS. 3A-3B are a block diagrams illustrating training a machine learning model which the system of FIG. 1 can use to generate failure predictions.

Now referring to FIG. 3A, as discussed above, the failure prediction engine 18 may train the failure prediction model 20 in accordance with the scheme 200. The failure prediction engine 18 can receive various input signals as training data 202. The input signals may include characteristics 208 of semiconductor devices obtained from the semiconductor characteristic database 26. The input signals may also include measurements 210 of semiconductor devices under stress conditions and parameters 212 characterizing the stress conditions obtained from the experiment database 24. The characteristics 208 and the measurements 210 may be the same semiconductor devices or the same type of semiconductor device. For example, the characteristics 208 may include characteristics of a SiC MOSFET, and the measurements 210 may be of the same SiC MOSFET or a similar SiC MOSFET. Further, the input signals may include failure parameters 214 of semiconductor devices (e.g., the semiconductor devices characterized by the measurements 210) indicating whether, when, and/or where the semiconductor devices experienced failures. For example, the measurements 210 may include measurements of a SiC MOSFET subject to a temperature curve reaching 800° C., and the failure parameters 214 may include whether the SiC MOSFET experienced a device failure, and if so, when, at what temperature, and where. In some embodiments, the failure parameters 214 may be included in the measurements 210, and feature extraction functions 204 (discussed below) may determine the failure parameters 214 by extracting the failure parameters 214 from the measurements 210 or deriving the failure parameters 214 based on the measurements 210.

The failure prediction engine 18 can apply the training data 202 to the failure prediction model 20 via feature extraction functions 204. Generally speaking, the feature extraction functions 204 can operate on at least some of the input signals 208, 210, 212, 214 to generate feature vectors, or logical groupings of parameters or attributes associated with each semiconductor device within the training data. For example, the feature extraction functions 204 may generate a feature vector $x_1$, where the values of the feature vector $x_1$ (i.e., "feature values") are parameters or attributes from the input signals for a particular semiconductor device (e.g., characteristics of the semiconductor device, measurements of the semiconductor device, parameters characterizing stress conditions applied to the semiconductor device). In addition, the feature extraction functions 204 can operate on the failure parameters 214 input signal to generate labels for the feature vectors, where each label corresponds to an attribute of the failure parameters 214. More particularly, the labels serve as indications of whether the combination of features within the feature vectors resulted in a device failure.

In this way, the feature extraction functions 204 operate on the input signals 208, 210, 212, 214 to generate an artificial intelligence (AI) training set 206. The AI training set 206 includes feature values 216 and extracted from the training data 202 via the feature extraction functions 204. The feature values 216 may be visualized as a matrix including feature vectors $x_1$-$x_n$, where the indices 1-$n$ refer to a semiconductor device subjected to at least one stress condition. For example, the feature vector $x_1$ may include feature values $x_{11}$, $x_{12}$, ..., $x_{1n}$. In some embodiments, the AI training set 206 also includes labels 218. Each feature vector (or a subset of the feature vectors) may correspond to a label of the labels 218 (e.g., the feature vector $x_1$ may correspond to label $L_1$. The feature values 216 thus represent the "input variables" for the failure prediction model 20, and the labels 218 represent the target "output variables" for the failure prediction model 20 (i.e., the parameters that the failure prediction model 20 is trained to predict).

The failure prediction engine 18 can train the failure prediction model 20 using the AI training set 206. Generally speaking, the failure prediction model 20 is configured according to an AI algorithm in order to make valid and reliable predictions for new inputs. The failure prediction engine 18 can train the failure prediction model 20 using supervised learning, unsupervised learning, reinforcement learning, or any other suitable technique. In some embodiments, the failure prediction engine 18 can train the failure prediction model 20 as a standard regression model.

As one example, in a supervised learning approach, the failure prediction engine 18 may provide the failure prediction model 20 with the feature values 216 (i.e., example inputs) and their associated labels 218 (i.e., example outputs) in order for the failure prediction model 20 to determine or discover rules, relationships, or patterns that map the feature values 216 to the labels 218. For example, the failure prediction model 20 may determine and/or assign weights or other metrics to given feature values across various feature categories of the feature values 216. The failure prediction model 20 is thus trained to determine mappings that predict, based on given feature values of a particular semiconductor device, whether and how such a semiconductor device is likely to fail. As another example, in an unsupervised learning approach, the failure prediction model 20 may be required to find its own structure in unlabeled example inputs (e.g., the failure prediction model 20 may only be provided with the feature values 216 and not the labels 218).

Over time, as the failure prediction engine 18 trains the failure prediction model 20, the failure prediction model 20 can learn to predict failure parameters of a given semiconductor device under a candidate stress condition based on characteristics of the given semiconductor device and parameters characterizing the candidate stress condition.

Based on the AI training set 206, the failure prediction model 20 can generate failure predictions 220 for semiconductor devices indicated in the AI training set 206. In some implementations, the failure prediction model 20 may be provided with a validation data set including similar data as the training data 202, and the failure prediction model 20 may generate the failure predictions 220 for semiconductor devices indicated in the validation data set. The failure predictions 220 may have error rates corresponding to the proportion of cases where the prediction is incorrect. A particular failure prediction may be classified as incorrect by manual classification or automatically by the failure prediction engine 18 based on comparison of the failure predictions 220 with the labels 218. In some embodiments, the error rates may be a metric assessing the difference between the actual and expected outputs of the failure prediction model 20. For example, for failure predictions that are associated with continuous variables, such as time to failure, a prediction may assessed based on how close the prediction is to the expected output. A feedback processing function 222 can provide feedback data to the failure prediction model 20 to tune the failure prediction model 20. The feedback data may indicate the error rates and may include adjustment operations to improve the failure prediction model 20 (e.g., adjusted weights assigned to the various feature values). Thus, in future iterations, the failure prediction model 20 can take into account the feedback data to decrease the error rate of the failure predictions 220.

Figure 3B:
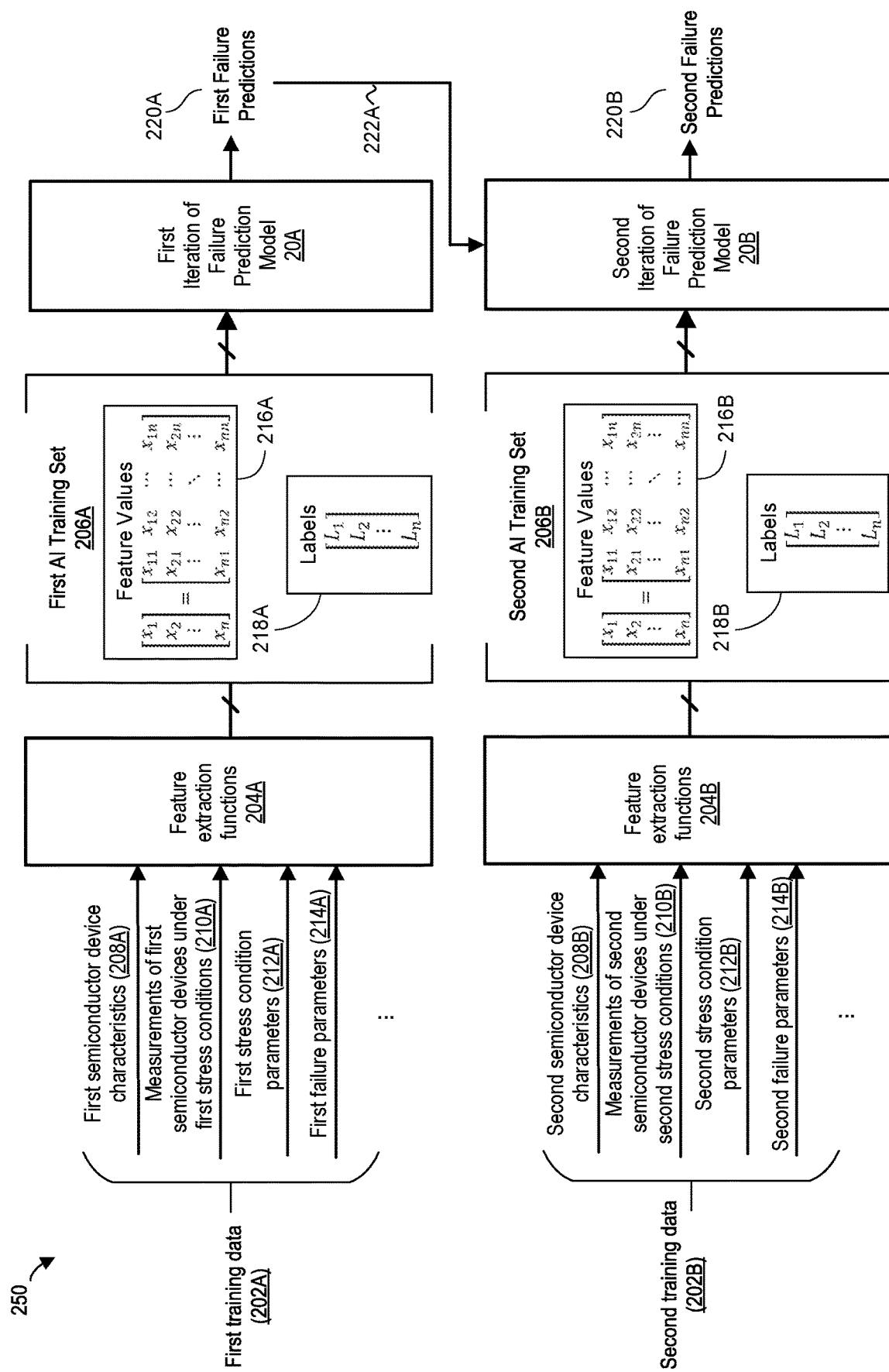

Referring now to FIG. 3B, as one example feedback procedure, the failure prediction engine 18 can train the failure prediction model 20 in accordance with scheme 250. To begin, the failure prediction engine can train a first iteration 20A of the failure prediction model 20 using the steps described with reference to FIG. 3A. The failure prediction engine 18 can receive first input signals as first training data 202A. The first input signals may include characteristics 208A of first semiconductor devices, measurements 210A of the first semiconductor devices under first stress conditions, parameters 212A characterizing the first stress conditions, and first failure parameters 214A of the first semiconductor devices. The failure prediction engine 18 can then operate on the first training data 202A using feature extraction functions 204A to generate a first AI training set 206A. Similarly to the AI training set 206, the first AI training set 206A may include feature values 216A based on attributes of the first training set 202A and labels 218A based on attributes of the first failure parameters 214A. Using the first AI training set 206A, the failure prediction engine 18 can train the first iteration 20A of the failure prediction model 20 and generate first failure predictions 220A having first error rates.

In addition, the failure prediction engine can also train a second iteration 20B of the failure prediction model 20 using the steps described with reference to FIG. 3A. The failure prediction engine 18 can receive second input signals as second training data 202B. The second input signals may include characteristics 208B of second semiconductor devices, measurements 210B of the second semiconductor devices under second stress conditions, parameters 212B characterizing the second stress conditions, and second failure parameters 214B of the second semiconductor devices. There may be overlap between the first and the second semiconductor devices. The failure prediction engine 18 can then operate on the second training data 202B using feature extraction functions 204B to generate a second AI training set 206B. Similarly to the AI training set 206, the second AI training set 206B may include feature values 216B based on attributes of the first training set 202B and labels 218B based on attributes of the second failure parameters 214B. Using the second AI training set 206B, the failure prediction engine 18 can train the second iteration 20B of the failure prediction model 20 and generate second failure predictions 220B having second error rates.

Further, a feedback processing function 222A can provide feedback data from the first failure predictions 220A to the second iteration 20B of the failure prediction model 20 to tune the second iteration 20B. Accordingly, the error rates of the second failure predictions may have a reduced overall error rate compared to an overall error rate of the error rates of the first failure predictions.

Figure 4:
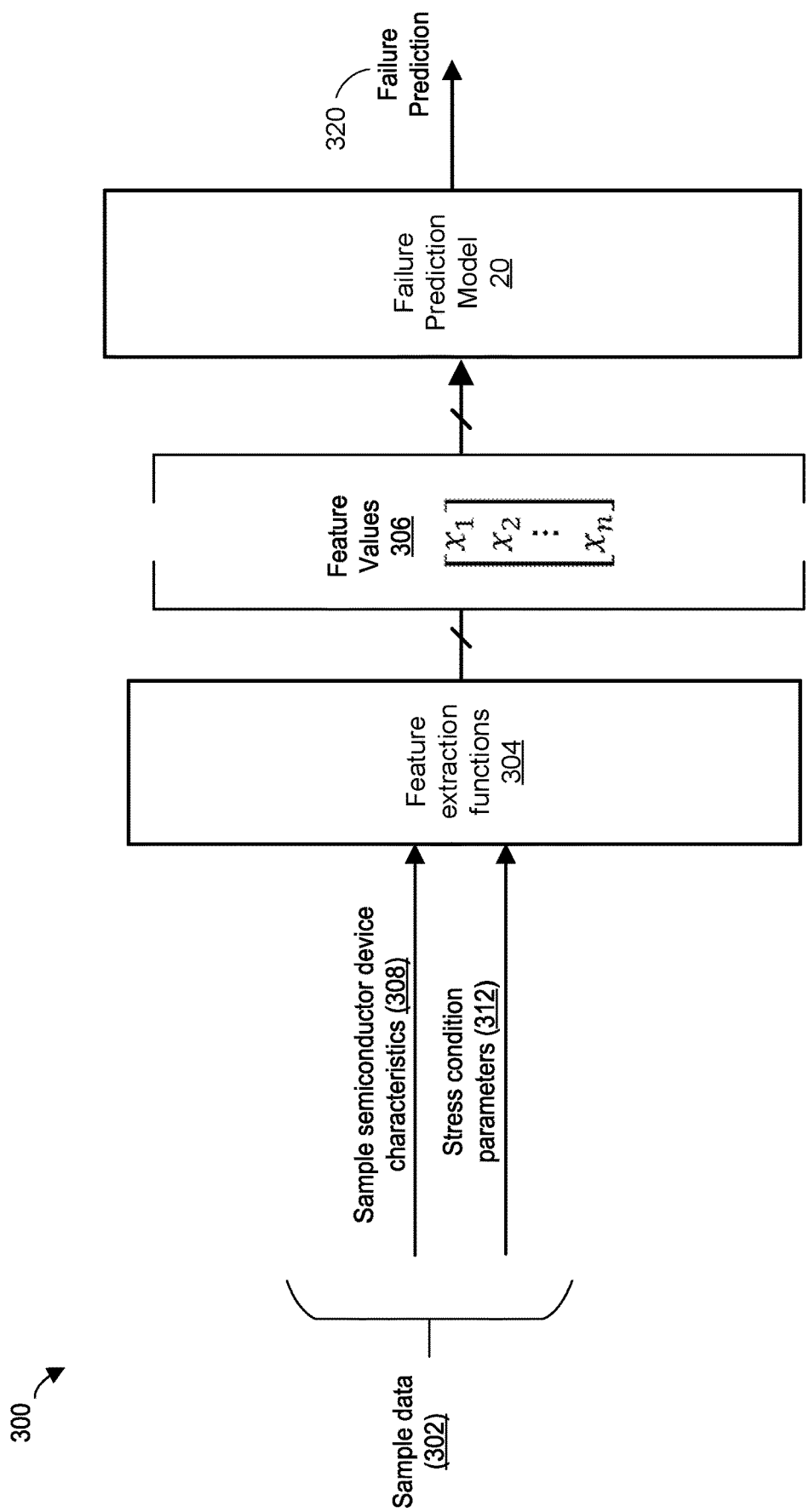
FIG. 4 is a block diagram illustrating applying a machine learning model to data relating to a sample semiconductor device to predict a failure parameter of the sample semiconductor device due to a stress condition.

Turning to FIG. 4, the failure prediction engine 18 may operate the trained failure prediction model 20 (which may be the second iteration 20B of the trained failure prediction model 20) in accordance with the scheme 300. As an initial note, while the discussion of FIG. 4 primarily refers to the failure prediction engine 18 stored at the server 12, as mentioned previously, the failure prediction application 38 implemented by the client device 32 may operate the trained prediction model 20. The failure prediction application 38 may receive a request for a failure prediction regarding a sample semiconductor device (e.g., from a user interacting with a GUI of the failure prediction application 38 displayed at the client device 32). In some embodiments, the failure prediction application 38 may format the request and transmit the formatted request to the server 12, where the failure prediction may be generated by the failure prediction engine 18 and transmitted to the client device 32 for display. In other embodiments, the failure prediction application 38 may operate the trained prediction model 20 at the client device 32.

In any event, the failure prediction engine 18 (or the failure prediction application 38) can receive input signals as sample data 302. The input signals may include characteristics 308 of a sample semiconductor device obtained from the sample semiconductor device database 48. The input signals also include parameters 312 characterizing a candidate stress condition. For example, a user may indicate a candidate stress condition by interacting with the failure prediction application 38.

The failure prediction engine 18 (or the failure prediction application 38) can apply the sample data 302 to the trained failure prediction model 20 via feature extraction functions 304. Similar to the feature extraction functions 204, the feature extraction functions 304 operate on at least some of the input signals 308 and 312 to generate feature values 306. The feature values 306 may include feature values of the characteristics 308 of the sample semiconductor device and the parameters 312 characterizing the candidate stress condition.

In turn, the failure prediction engine 18 (or the failure prediction application 38) inputs the feature values 306 into the trained failure prediction model 20 to generate a failure prediction 320 regarding the sample semiconductor device. The failure prediction 320 may include a failure parameter of the sample semiconductor device due to the candidate stress condition, such as whether a failure is predicted to occur, a predicted time to failure, a predicted failure rate, a predicted FIT rate, a predicted presence of defect formation (e.g., whether defects will occur, when defects will occur, a degree of defect formation, or where defects will occur), or a predicted location of failure.

Although the examples of this disclosure primarily refer to the trained failure prediction model 20 as configured according to an AI algorithm, some embodiments may not be trained in accordance with AI or machine learning techniques. The failure prediction model 20, for example, may be configured according to an algorithm that assigns weights to a plurality of feature values (e.g., the feature values 306) according to analysis of a previous plurality of feature values (e.g., the feature values 216). The failure prediction model 20 may be operable to output a failure prediction based on the plurality of feature values.

Next, several example methods which the server 12 and/or the client device 32 can implement are discussed with reference to FIGS. 5-7.

Figure 5:
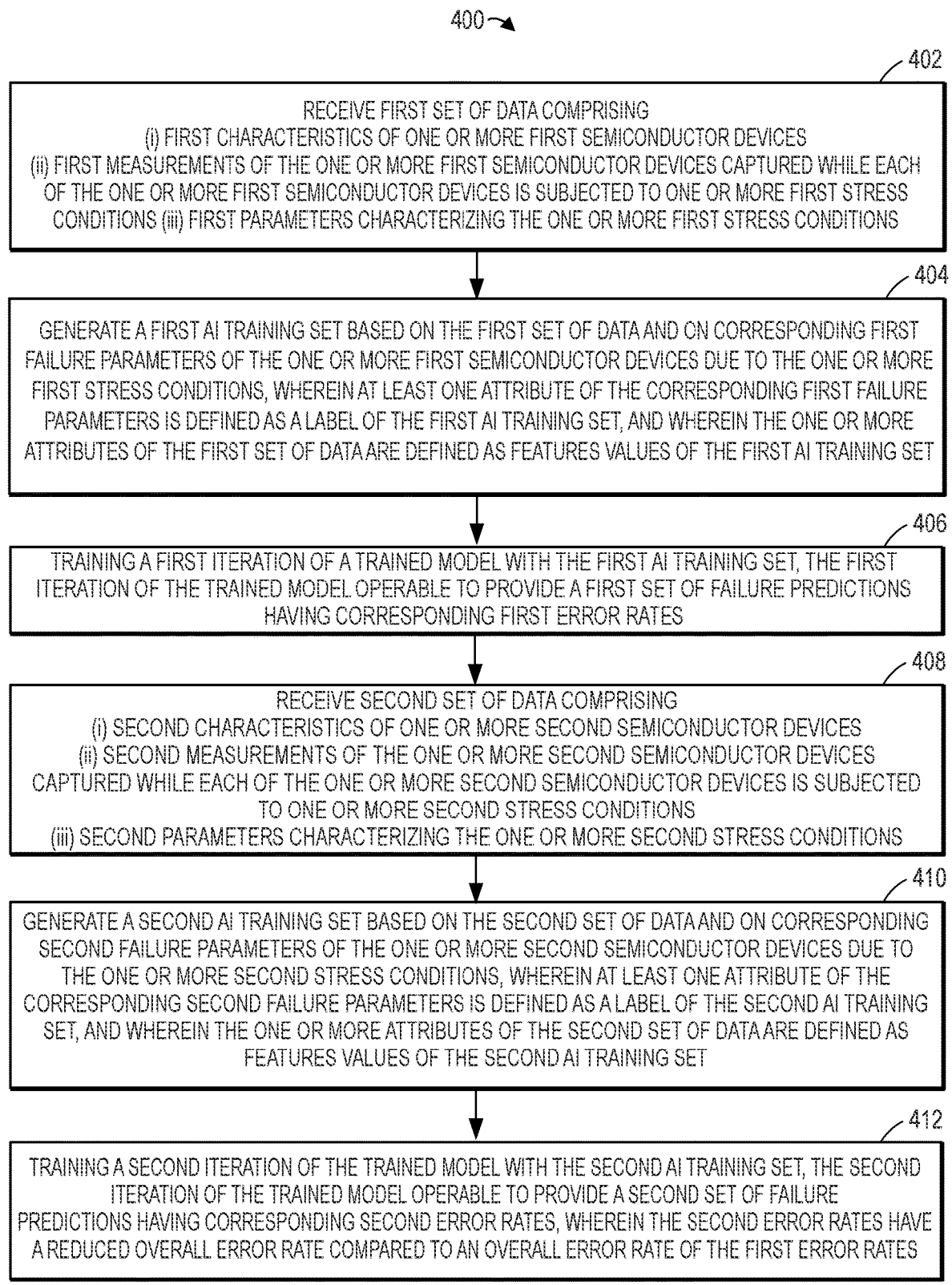
FIG. 5 is a flow diagram of an example method for training a model to predict failure parameters of semiconductor devices.

Referring first to FIG. 5, the server 12 can implement an example method 400 to train a model to predict failure parameters of semiconductor devices. The method 400 may be implemented as a set of instructions executable by processing hardware such as one or more processors (e.g., the processor(s) 14).

At block 402, the server 12 receives a first set of data comprising: (i) first characteristics of one or more first semiconductor devices, (ii) first measurements of the one or more first semiconductor devices captured while each of the one or more first semiconductor devices is subjected to one or more first stress conditions, and (iii) first parameters characterizing the one or more first stress conditions (e.g., the training data 202, the training data 202A).

At block 404, the server 12 generates a first AI training set based on the first set of data and on corresponding first failure parameters of the one or more first semiconductor devices due to the one or more first stress conditions (e.g., the AI training set 206, the first AI training set 206A). At least one attribute of the corresponding first failure parameters is defined as a label of the first AI training set (e.g., the labels 218, the labels 218A), and one or more attributes of the first set of data are defined as feature values of the first AI training set (e.g., the feature values 216, the feature values 216A).

At block 406, the server 12 trains a first iteration of a trained model with the first AI training set (e.g., the failure prediction model 20, the first iteration 20A of the failure prediction model 20). The first iteration of the trained model is operable to provide a first set of failure predictions having corresponding first error rates (e.g., the failure predictions 220, the first failure predictions 220A).

Next, at block 408, the server 12 receives a second set of data comprising: (i) second characteristics of one or more second semiconductor devices, (ii) second measurements of the one or more second semiconductor devices captured while each of the one or more second semiconductor devices is subjected to one or more second stress conditions, and (iii) second parameters characterizing the one or more second stress conditions (e.g., the second training data 202B).

At block 410, the server 12 generates a second AI training set based on the second set of data and on corresponding second failure parameters of the one or more second semiconductor devices due to the one or more second stress conditions (e.g., the second AI training set 206B). At least one attribute of the corresponding second failure parameters is defined as a label of the second AI training set (e.g., the labels 218B), and one or more attributes of the second set of data are defined as feature values of the second AI training set (e.g., the feature values 216B).

Further, at block 412, the server 12 trains a second iteration of the trained model with the second AI training set (e.g., the second iteration 20B of the failure prediction model 20). The second iteration of the trained model is operable to provide a second set of failure predictions having corresponding second error rates (e.g., the second failure predictions 220B). The second error rates may have a reduced overall error rate compared to an overall error rate of the first error rates.

The following considerations may also apply to the method 400. The first failure parameters may include first failure rates of the one or more first semiconductor devices, and the second failure parameters may include second failure rates of the one or more second semiconductor devices. The first and/or second failure rates may include FIT rates. Further, the first failure parameters may include first times to failure of the one or more first semiconductor devices, and the second failure parameters may include second times to failure of the one or more second semiconductor devices. In addition, the first failure parameters may include first indications of defect formation within the one or more first semiconductor devices, and the second failure parameters may include second indications of defect formation within the one or more second semiconductor devices. Indications of defect formation may include whether defects occurred, when defects occurred (e.g., relative to initial application of the stress condition), a degree of defect formation, or where defects occurred.

The first and second measurements may include voltage measurements, current measurements, or x-ray images of the one or more first and second semiconductor devices, respectively. Further, the first and second measurements may be synchronously captured at points of failure of the first and second semiconductor devices, respectively, and/or may be captured over a range of times from application of stress conditions up to and including the points of failure. Still further, the first and second measurements may include baseline measurements of the first and second semiconductor devices, respectively, captured before application of the stress conditions.

With regard to the semiconductor devices, the first and second semiconductor devices may all be of the same type, or may be include different types of devices. For example, a subset of the first semiconductor devices may be of the same type of semiconductor device as a subset of the second semiconductor devices. The first and second characteristics of the first and second semiconductor devices, respectively, may include material types, operating voltages, and current ratings of the first and second semiconductor devices.

Referring to the stress conditions, the first and second stress conditions may include high temperatures, such as temperatures greater than 100° C. or greater than 700° C. Additionally or alternatively, the first and second stress conditions may include neutron radiation incident on one or more of semiconductor devices. The neutron flux of the neutron radiation may be greater than $10^5$ neutrons/cm$^2$/s. Further, the neutron radiation may be incident on one or more of the semiconductor devices at a non-zero angle of incidence or a range of angles of incidence. Additionally or alternatively, the first and second stress conditions may include voltage or current spikes applied to one or more of the semiconductor devices.

Figure 6:
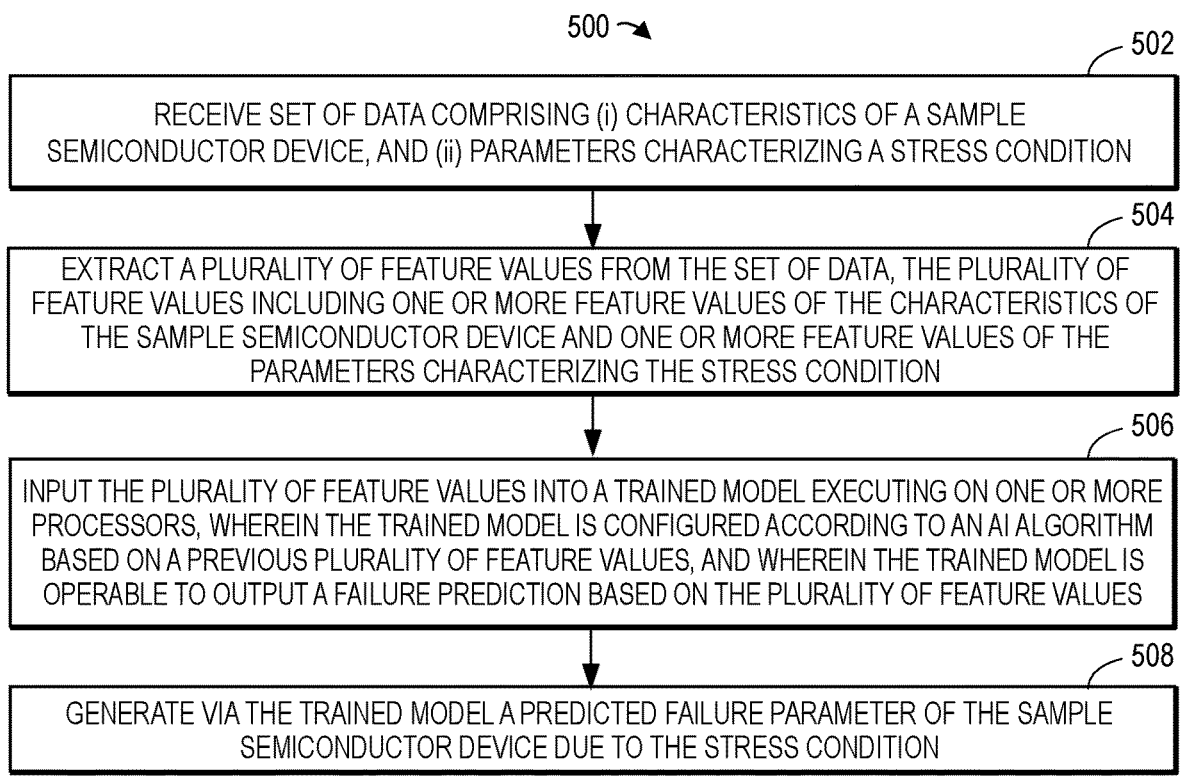
FIG. 6 is a flow diagram of an example method for predicting failure parameters of a sample semiconductor device using a trained model.

Referring next to FIG. 6, the server 12 and/or the client device 32 can implement an example method 500 for predicting failure parameters of semiconductor devices. The method 500 may be implemented as a set of instructions executable by processing hardware such as one or more processors (e.g., the processor(s) 14 or 34). For convenience, the method 500 is discussed below with reference to the client device 32.

The method 500 begins at block 502, where the client device 32 receives a set of data comprising: (i) characteristics of a sample semiconductor device, and (ii) parameters characterizing a stress condition (e.g., the sample data 302). The characteristics may include a material type, operating voltage, and/or current rating of the sample semiconductor device. The stress condition, for example, high temperatures (e.g., a temperature greater than 100° C. or a temperature greater than 700° C., neutron radiation (e.g., a neutron beam with a flux greater than $10^5$ neutrons/cm$^2$/s), a voltage spike, or a current spike.

At block 504, the client device 32 extracts a plurality of feature values from the set of data (e.g., the feature values 306). The plurality of feature values including one or more feature values of the characteristics of the sample semiconductor device and one or more feature values of the parameters characterizing the stress condition.

Next, at block 506, the client device 32 inputs the plurality of feature values into a trained model (e.g., the failure prediction model 20) executing on one or more processors (e.g., the processor(s) 34). The trained model may be configured according to an artificial intelligence (AI) algorithm based on a previous plurality of feature values. Further, the trained model may be operable to output a failure prediction based on the plurality of feature values. At block 508, the client device 32 generates, via the trained model, a predicted failure parameter of the sample semiconductor device due to the stress condition (e.g., the failure prediction 320). The predicted failure parameter may be, for example, a predicted failure rate, a predicted FIT rate, a predicted time to failure, or a predicted presence of defect formation for the sample semiconductor device.

Figure 7:
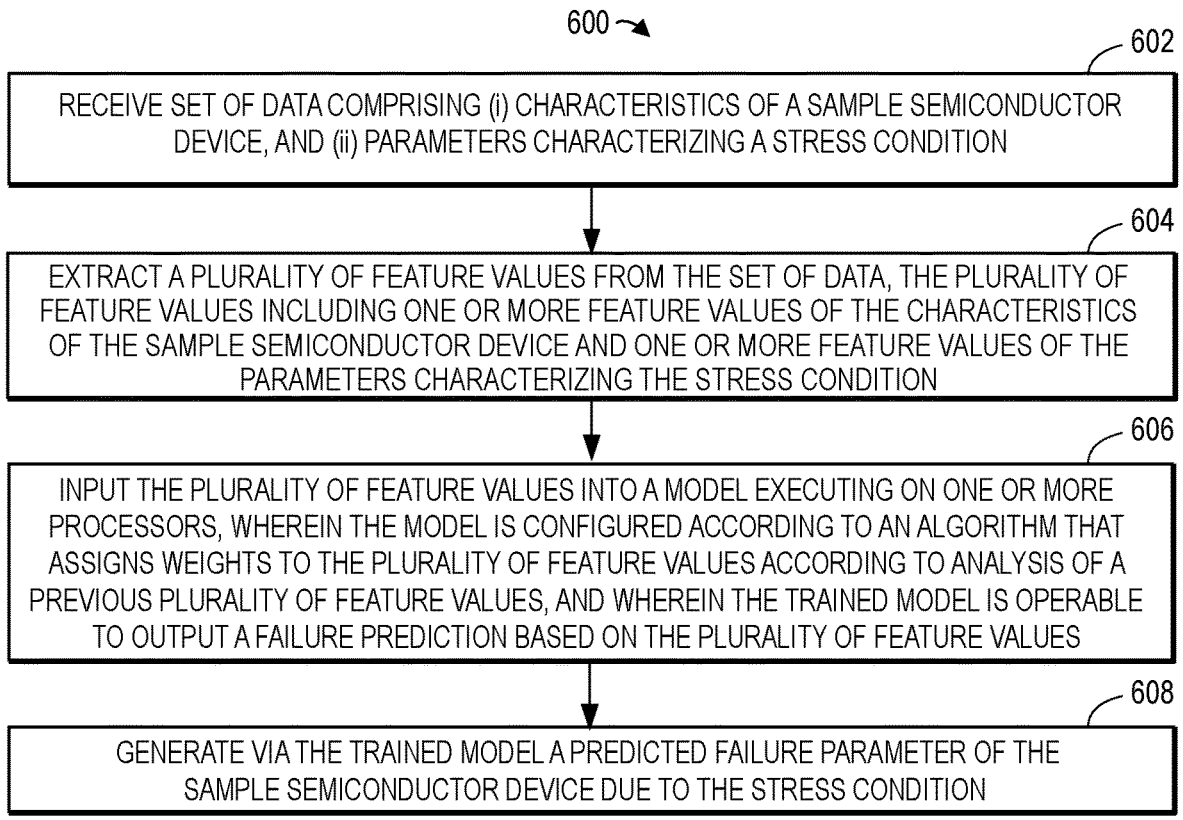
FIG. 7 is a flow diagram of an example method for predicting failure parameters of a sample semiconductor device using a model.

Referring next to FIG. 7, the server 12 and/or the client device 32 can implement an example method 600 for predicting failure parameters of semiconductor devices. The method 600 may be implemented as a set of instructions executable by processing hardware such as one or more processors (e.g., the processor(s) 14 or 34). For convenience, the method 600 is discussed below with reference to the client device 32.

At block 602, the client device 32 receives a set of data comprising: (i) characteristics of a sample semiconductor device, and (ii) parameters characterizing a stress condition. At block 604, the client device extracts a plurality of feature values from the set of data. The plurality of feature values may include one or more feature values of the characteristics of the sample semiconductor device and one or more feature values of the parameters characterizing the stress condition.

At block 606, the client device 32 inputs the plurality of feature values into a model executing on one or more processors (e.g., the processor(s) 34). The model may be configured according to an algorithm that assigns weights to the plurality of feature values according to analysis of a previous plurality of feature values. Further, the model may be operable to output a failure prediction based on the plurality of feature values. At block 608, the client device 32 generates, via the model, a predicted failure parameter of the sample semiconductor device due to the stress condition.

The following list of aspects reflects a variety of the embodiments explicitly contemplated by the present disclosure. Those of ordinary skill in the art will readily appreciate that the aspects below are neither limiting of the embodiments disclosed herein, nor exhaustive of all of the embodiments conceivable from the disclosure above, but are instead meant to be exemplary in nature.

1. A method for training a model to predict failure parameters of semiconductor devices, the method comprising: receiving, at one or more processors, a first set of data comprising: (i) first characteristics of one or more first semiconductor devices; (ii) first measurements of the one or more first semiconductor devices captured while each of the one or more first semiconductor devices is subjected to one or more first stress conditions; and (iii) first parameters characterizing the one or more first stress conditions; generating, by the one or more processors, a first artificial intelligence (AI) training set based on the first set of data and on corresponding first failure parameters of the one or more first semiconductor devices due to the one or more first stress conditions, wherein at least one attribute of the corresponding first failure parameters is defined as a label of the first AI training set, and wherein one or more attributes of the first set of data are defined as feature values of the first AI training set; training, by the one or more processors, a first iteration of a trained model with the first AI training set, the first iteration of the trained model operable to provide a first set of failure predictions having corresponding first error rates; receiving, at the one or more processors, a second set of data comprising: (i) second characteristics of one or more second semiconductor devices; (ii) second measurements of the one or more second semiconductor devices captured while each of the one or more second semiconductor devices is subjected to one or more second stress conditions; and (iii) second parameters characterizing the one or more second stress conditions; generating, by the one or more processors, a second AI training set based on the second set of data and on corresponding second failure parameters of the one or more second semiconductor devices due to the one or more second stress conditions, wherein at least one attribute of the corresponding second failure parameters is defined as a label of the second AI training set, and wherein one or more attributes of the second set of data are defined as feature values of the second AI training set; and training, by the one or more processors, a second iteration of the trained model with the second AI training set, the second iteration of the trained model operable to provide a second set of failure predictions having corresponding second error rates, wherein the second error rates have a reduced overall error rate compared to an overall error rate of the first error rates.

2. A method according to aspect 1, wherein: the first failure parameters include first failure rates of the one or more first semiconductor devices; and the second failure parameters include second failure rates of the one or more second semiconductor devices.

3. A method according to aspect 2, wherein the first failure rates and the second failure rates are failure-in-time (FIT) rates.

4. A method according to any one of aspects 1 to 3, wherein: the first failure parameters include first times to failure of the one or more first semiconductor devices; and the second failure parameters include second times to failure of the one or more second semiconductor devices.

5. A method according to any one of aspects 1 to 4, wherein: the first failure parameters include first indications of defect formation within the one or more first semiconductor devices; and the second failure parameters include second indications of defect formation within the one or more second semiconductor devices.

6. A method according to any one of aspects 1 to 5, wherein: the first measurements of the one or more semiconductor devices include first current measurements of the one or more first semiconductor devices; and the second measurements of the one or more semiconductor devices include second current measurements of the one or more second semiconductor devices.

7. A method according to any one of aspects 1 to 6, wherein: the first measurements of the one or more semiconductor devices include first voltage measurements of the one or more first semiconductor devices; and the second measurements of the one or more semiconductor devices include second voltage measurements of the one or more second semiconductor devices.

8. A method according to any one of aspects 1 to 7, wherein: the first measurements of the one or more semiconductor devices include first x-ray images of the one or more first semiconductor devices; and the second measurements of the one or more semiconductor devices include second x-ray images of the one or more second semiconductor devices.

9. A method according to any one of aspects 1 to 8, wherein: the first measurements of the one or more first semiconductor devices are captured between initial application of the one or more first stress conditions and first points of failure of the one or more first semiconductor devices; and the second measurements of the one or more second semiconductor devices are captured between initial application of the one or more second stress conditions and second points of failure of the one or more second semiconductor devices.

10. A method according to any one of aspects 1 to 9, wherein: the first measurements of the one or more first semiconductor devices are captured at first points of failure of the one or more first semiconductor devices; and the second measurements of the one or more second semiconductor devices are captured at second points of failure of the one or more second semiconductor devices.

11. A method according to any one of aspects 1 to 10, wherein: the first measurements further include first baseline measurements of the one or more first semiconductor devices captured while the one or more first semiconductor devices are not subjected to the one or more first stress conditions; and the second measurements further include second baseline measurements of the one or more second semiconductor devices captured while the one or more second semiconductor devices are not subjected to the one or more second stress conditions.

12. A method according to any one of aspects 1 to 11, wherein: the one or more first semiconductor devices are of a same type; and the one or more second semiconductor devices are of the same type.

13. A method according to any one of aspects 1 to 11, wherein: at least a first subset of the one or more first semiconductor devices are of a same type; and at least a second subset of the one or more second semiconductor devices are of the same type.

14. A method according to any one of aspects 1 to 13, wherein: the first characteristics include first material types of the one or more first semiconductor devices; and the second characteristics include second material types of the one or more second semiconductor devices.

15. A method according to any one of aspects 1 to 14, wherein: the first characteristics include first operating voltages of the one or more first semiconductor devices; and the second characteristics include second operating voltages of the one or more second semiconductor devices.

16. A method according to any one of aspects 1 to 15, wherein: the first characteristics include first current ratings of the one or more first semiconductor devices; and the second characteristics include second current ratings of the one or more second semiconductor devices.

17. A method according to any one of aspects 1 to 16, wherein the one or more first stress conditions and the one or more second stress conditions include a temperature greater than 100° C.

18. A method according to any one of aspects 1 to 16, wherein the one or more first stress conditions and the one or more second stress conditions include a temperature greater than 700° C.

19. A method according to any one of aspects 1 to 18, wherein the one or more first stress conditions and the one or more second stress conditions include neutron radiation incident on at least one of the one or more first semiconductor devices and at least one of the one or more second semiconductor devices, respectively.

20. A method according to aspect 19, where a neutron flux of the neutron radiation is greater than $10^5$ neutrons/cm$^2$/s.

21. A method according to any one of aspects 19 to 20, wherein the neutron radiation is incident on the at least one of the one or more first semiconductor devices and the at least one of the one or more second semiconductor devices at a non-zero angle of incidence.

22. A method according to any one of aspects 1 to 21, wherein: the one or more first stress conditions include a first voltage spike applied to at least one of the one or more first semiconductor devices; and the one or more second stress conditions include a second voltage spike applied to at least one of the one or more second semiconductor devices.

23. A method according to any one of aspects 1 to 22, wherein: the one or more first stress conditions include a first current spike applied to at least one of the one or more first semiconductor devices; and the one or more second stress conditions include a second current spike applied to at least one of the one or more second semiconductor devices.

24. A method for predicting failure parameters of semiconductor devices, the method comprising: receiving, at one or more processors, a set of data comprising: (i) characteristics of a sample semiconductor device; and (ii) parameters characterizing a stress condition; extracting, by the one or more processors, a plurality of feature values from the set of data, the plurality of feature values including one or more feature values of the characteristics of the sample semiconductor device and one or more feature values of the parameters characterizing the stress condition; inputting, by the one or more processors, the plurality of feature values into a trained model executing on the one or more processors, wherein the trained model is configured according to an artificial intelligence (AI) algorithm based on a previous plurality of feature values, and wherein the trained model is operable to output a failure prediction based on the plurality of feature values; and generating, by the one or more processors via the trained model, a predicted failure parameter of the sample semiconductor device due to the stress condition.

25. A method according to aspect 24, wherein generating the predicted failure parameter includes generating a predicted failure rate of the sample semiconductor device.

26. A method according to aspect 25, wherein generating the predicted failure rate includes generating a predicted failure-in-time (FIT) rate.

27. A method according to any one of aspects 24 to 26, wherein generating the predicted failure parameter includes generating a predicted time to failure of the sample semiconductor device.

28. A method according to any one of aspects 24 to 27, wherein generating the predicted failure parameter includes generating a predicted presence of defect formation.

29. A method according to any one of aspects 24 to 28, wherein the characteristics of the sample semiconductor device include a material type of the sample semiconductor device.

30. A method according to any one of aspects 24 to 29, wherein the characteristics of the sample semiconductor device include an operating voltage of the sample semiconductor device.

31. A method according to any one of aspects 24 to 30, wherein the characteristics of the sample semiconductor device include a current rating of the sample semiconductor device.

32. A method according to any one of aspects 24 to 31, wherein the stress condition includes a temperature greater than 100° C.

33. A method according to any one of aspects 24 to 32, wherein the stress condition includes a temperature greater than 700° C.

34. A method according to any one of aspects 24 to 33, wherein the stress condition includes neutron radiation.

35. A method according to aspect 34, where a neutron flux of the neutron radiation is greater than $10^5$ neutrons/cm$^2$/s.

36. A method according to any one of aspects 24 to 35, wherein the stress condition includes a voltage spike.

37. A method according to any one of aspects 24 to 36, wherein the stress condition includes a current spike.

38. A method for predicting failure parameters of semiconductor devices, the method comprising: receiving, at one or more processors, a set of data comprising: (i) characteristics of a sample semiconductor device; and (ii) parameters characterizing a stress condition; extracting, by the one or more processors, a plurality of feature values from the set of data, the plurality of feature values including one or more feature values of the characteristics of the sample semiconductor device and one or more feature values of the parameters characterizing the stress condition; inputting, by the one or more processors, the plurality of feature values into a model executing on the one or more processors, wherein the model is configured according to an algorithm that assigns weights to the plurality of feature values according to analysis of a previous plurality of feature values, and wherein the model is operable to output a failure prediction based on the plurality of feature values; and generating, by the one or more processors via the model, a predicted failure parameter of the sample semiconductor device due to the stress condition.

What is claimed is:

1. A method for training a model to predict failure parameters of semiconductor devices, the method comprising:
    receiving, at one or more processors, a first set of data comprising:
        (i) first characteristics of one or more first semiconductor devices;
        (ii) first measurements of the one or more first semiconductor devices captured while each of the one or more first semiconductor devices is subjected to one or more first stress conditions; and
        (iii) first parameters characterizing the one or more first stress conditions;
    generating, by the one or more processors, a first artificial intelligence (AI) training set based on the first set of data and on corresponding first failure parameters of the one or more first semiconductor devices due to the one or more first stress conditions, wherein at least one attribute of the corresponding first failure parameters is defined as a label of the first AI training set, and wherein one or more attributes of the first set of data are defined as feature values of the first AI training set;
    training, by the one or more processors, a first iteration of a trained model with the first AI training set, the first iteration of the trained model operable to provide a first set of failure predictions having corresponding first error rates;
    receiving, at the one or more processors, a second set of data comprising:
        (i) second characteristics of one or more second semiconductor devices;
        (ii) second measurements of the one or more second semiconductor devices captured while each of the one or more second semiconductor devices is subjected to one or more second stress conditions; and
        (iii) second parameters characterizing the one or more second stress conditions;
    generating, by the one or more processors, a second AI training set based on the second set of data and on corresponding second failure parameters of the one or more second semiconductor devices due to the one or more second stress conditions, wherein at least one attribute of the corresponding second failure parameters is defined as a label of the second AI training set, and wherein one or more attributes of the second set of data are defined as feature values of the second AI training set; and
    training, by the one or more processors, a second iteration of the trained model with the second AI training set, the second iteration of the trained model operable to provide a second set of failure predictions having corresponding second error rates, wherein the second error rates have a reduced overall error rate compared to an overall error rate of the first error rates.

2. A method according to claim 1, wherein:
the first failure parameters include first failure rates of the one or more first semiconductor devices; and
the second failure parameters include second failure rates of the one or more second semiconductor devices.

3. A method according to claim 1, wherein:
the first failure parameters include first times to failure of the one or more first semiconductor devices; and
the second failure parameters include second times to failure of the one or more second semiconductor devices.

4. A method according to claim 1, wherein:
the first failure parameters include first indications of defect formation within the one or more first semiconductor devices; and
the second failure parameters include second indications of defect formation within the one or more second semiconductor devices.

5. A method according to claim 1, wherein:
the first measurements of the one or more semiconductor devices include at least one of first current measurements or first voltage measurements of the one or more first semiconductor devices; and
the second measurements of the one or more semiconductor devices include at least one of second current measurements or second voltage measurements of the one or more second semiconductor devices.

6. A method according to claim 1, wherein:
the first measurements of the one or more semiconductor devices include first x-ray images of the one or more first semiconductor devices; and
the second measurements of the one or more semiconductor devices include second x-ray images of the one or more second semiconductor devices.

7. A method according to claim 1, wherein:
the first measurements of the one or more first semiconductor devices are captured at first points of failure of the one or more first semiconductor devices; and
the second measurements of the one or more second semiconductor devices are captured at second points of failure of the one or more second semiconductor devices.

8. A method according to claim 1, wherein:
the first characteristics include first material types of the one or more first semiconductor devices; and
the second characteristics include second material types of the one or more second semiconductor devices.

9. A method according to claim 1, wherein:
the first characteristics include at least one of first operating voltages, first voltage ratings, or first current ratings of the one or more first semiconductor devices; and
the second characteristics include second operating voltages, second voltage ratings, or second current ratings of the one or more second semiconductor devices.

10. A method according to claim 1, wherein the one or more first stress conditions and the one or more second stress conditions include a temperature greater than 700° C.

11. A method according to claim 1, wherein the one or more first stress conditions and the one or more second stress conditions include neutron radiation incident at a non-zero angle of incidence on at least one of the one or more first semiconductor devices and at least one of the one or more second semiconductor devices, respectively, wherein a neutron flux of the neutron radiation is greater than $10^5$ neutrons/cm²/s.

12. A method according to claim 1, wherein:
the one or more first stress conditions include at least one of a first voltage spike or a first current spike applied to at least one of the one or more first semiconductor devices; and
the one or more second stress conditions include at least one of a second voltage spike or a second current spike applied to at least one of the one or more second semiconductor devices.

13. A method for predicting failure parameters of semiconductor devices, the method comprising:
receiving, at one or more processors, a set of data comprising:
(i) characteristics of a sample semiconductor device; and
(ii) parameters characterizing a stress condition;
extracting, by the one or more processors, a plurality of feature values from the set of data, the plurality of feature values including one or more feature values of the characteristics of the sample semiconductor device and one or more feature values of the parameters characterizing the stress condition;
inputting, by the one or more processors, the plurality of feature values into a trained model executing on the one or more processors, wherein the trained model is configured according to an artificial intelligence (AI) algorithm based on a previous plurality of feature values, and wherein the trained model is operable to output a failure prediction based on the plurality of feature values; and
generating, by the one or more processors via the trained model, a predicted failure parameter of the sample semiconductor device due to the stress condition.

14. A method according to claim 13, wherein generating the predicted failure parameter includes generating at least one of a predicted failure rate of the sample semiconductor device, a predicted time to failure of the sample semiconductor device, or a predicted presence of defect formation within the sample semiconductor device.

15. A method according to claim 13, wherein the characteristics of the sample semiconductor device include a material type of the sample semiconductor device.

16. A method according to claim 13, wherein the characteristics of the sample semiconductor device include at least one of an operating voltage, a current rating, or a voltage rating of the sample semiconductor device.

17. A method according to claim 13, wherein the stress condition includes a temperature greater than 700° C.

18. A method according to claim 13, wherein the stress condition includes neutron radiation with a neutron flux greater than $10^5$ neutrons/cm²/s applied at a non-zero angle of incidence.

19. A method according to claim 13, wherein the stress condition includes at least one of a voltage spike or a current spike.

20. A method for predicting failure parameters of semiconductor devices, the method comprising:
receiving, at one or more processors, a set of data comprising:
(i) characteristics of a sample semiconductor device; and
(ii) parameters characterizing a stress condition;
extracting, by the one or more processors, a plurality of feature values from the set of data, the plurality of feature values including one or more feature values of the characteristics of the sample semiconductor device and one or more feature values of the parameters characterizing the stress condition;
inputting, by the one or more processors, the plurality of feature values into a model executing on the one or more processors, wherein the model is configured according to an algorithm that assigns weights to the plurality of feature values according to analysis of a previous plurality of feature values, and wherein the model is operable to output a failure prediction based on the plurality of feature values; and
generating, by the one or more processors via the model, a predicted failure parameter of the sample semiconductor device due to the stress condition.

* * * * *

UNITED STATES PATENT AND TRADEMARK OFFICE
CERTIFICATE OF CORRECTION

PATENT NO. : 11,493,548 B2
APPLICATION NO. : 17/383776
DATED : November 8, 2022
INVENTOR(S) : Moinuddin Ahmed et al.

It is certified that error appears in the above-identified patent and that said Letters Patent is hereby corrected as shown below:

In the Claims

Column 22, Line 11, "Al" should be -- AI --.

Signed and Sealed this
Thirtieth Day of May, 2023

Katherine Kelly Vidal
*Director of the United States Patent and Trademark Office*